(12) United States Patent
Nakaharada et al.

(10) Patent No.: US 7,563,042 B2
(45) Date of Patent: Jul. 21, 2009

(54) SUBSTRATE CARRYING APPARATUS, SUBSTRATE CARRYING METHOD, AND COATING AND DEVELOPING APPARATUS

(75) Inventors: Masahiro Nakaharada, Koshi (JP); Seiki Ishida, Koshi (JP); Taro Yamamoto, Koshi (JP); Katsuhiro Morikawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 495 days.

(21) Appl. No.: 11/504,785

(22) Filed: Aug. 16, 2006

(65) Prior Publication Data

US 2007/0195297 A1 Aug. 23, 2007

(30) Foreign Application Priority Data

Sep. 1, 2005 (JP) ............................. 2005-254158

(51) Int. Cl.
*G03D 5/00* (2006.01)
*G03B 27/52* (2006.01)
*C23C 16/18* (2006.01)

(52) U.S. Cl. .................... 396/611; 355/27; 118/728; 414/941

(58) Field of Classification Search ................. 396/611; 355/27, 30; 414/935, 941; 118/715, 728, 118/729
See application file for complete search history.

(56) References Cited

U.S. PATENT DOCUMENTS

| 6,168,669 | B1 | 1/2001 | Yasuda et al. |
| 6,540,468 | B1 * | 4/2003 | Blattner et al. ......... 414/416.08 |
| 6,577,382 | B2 * | 6/2003 | Kida et al. .................... 355/77 |
| 7,290,813 | B2 * | 11/2007 | Bonora et al. ................ 294/1.1 |

FOREIGN PATENT DOCUMENTS

JP 11-243133 9/1999

* cited by examiner

*Primary Examiner*—Alan A Mathews
(74) *Attorney, Agent, or Firm*—Smith, Gambrell & Russell, LLP

(57) ABSTRACT

A substrate carrying apparatus includes an arm body; supporting portion provided in the arm body and adapted to support a region inside the periphery of the rear face of the substrate; a one-side restricting portion and an other-side restricting portion provided at opposite positions across the periphery of the substrate to restrict the peripheral positions of the substrate; and liquid receivers provided between each supporting portion and each restricting portion. A liquid drop attached to the rear peripheral portion of the substrate flows down on the bottom face of each liquid receiver. Even though repeated substrate carrying operations are performed and thus the liquid drop is accumulated in each liquid receiver, there is no risk that the liquid drop in each liquid receiver would be scattered in the air by the action of the periphery of the substrate and hence the scattered liquid would be attached again onto the surface of the substrate.

13 Claims, 14 Drawing Sheets

SUBSTRATE CARRYING APPARATUS, SUBSTRATE CARRYING METHOD, AND COATING AND DEVELOPING APPARATUS

BACKGROUND OF THE INVENTION

1. Field of the Invention

The present invention relates to a substrate carrying apparatus, a substrate carrying method, and a coating and developing apparatus equipped with the substrate carrying apparatus, for carrying substrates having subjected to a process in which a liquid remains on a periphery of the rear face of each substrate, such as a dipping exposure process.

2. Background Art

Conventionally, in a photo-resist process, which is one of the processes for manufacturing semiconductors, semiconductor wafers (hereinafter referred to as wafers) are coated with a resist on their surfaces; and the resist is exposed to light through a predetermined pattern, and thereafter a developing liquid is supplied to the wafers to develop and form a resist pattern. This process is performed using a system in which an exposure machine is connected to a processing block of a coating and developing apparatus generally including a coating unit and a developing unit.

Transferring wafers from the processing block to the exposure machine or from the exposure machine to the processing block is performed via an interface residing between the processing block and the exposure machine. In the interface, for example, two substrate carrying apparatuses are provided.

In recent years, an exposure technique, referred to as a dipping exposure process, has been studied for the purpose of enhancing resolution of exposure due to the need for micromachining and thin-film forming of device patterns. What is meant by a "dipping exposure process" is an exposure process in which a liquid layer, such as a layer of ultra-pure water, is first formed for transmitting light through the layer onto a surface of a wafer, and the wafer surface is then irradiated with light generated from a light source through the liquid layer, whereby a predetermined circuit pattern can be transferred to a resist on the wafer surface. More specifically, if, for example, ArF is used as a light source for performing the exposure process, the wavelength of light generated from the light source is 193 nm in the air, but becomes substantially 134 nm in water. Thus, in this technique, a high resolution exposure process can be performed by utilizing such a phenomenon that the wavelength of light becomes short in water.

An exposure apparatus adapted to perform such a dipping exposure process is briefly explained with reference to FIG. 12. An exposure means 1 facing a wafer W with a gap is arranged above the wafer W held in a horizontal position by a holding means (not shown). A lens 1a is provided in a central distal end of the exposure means 1, and a supply port 1b for supplying a solution, for example, pure water, for forming a liquid layer on the surface of the wafer W and a suction port 1c for suctioning and recovering the pure water supplied to the wafer W are arranged around the outer periphery of the lens 1a. In this case, by supplying pure water to the surface of the wafer W from the supply port 1b while recovering pure water from the suction port 1c, a liquid film or layer (pure water film) can be formed between the lens 1a and the surface of the wafer W. Thereafter, light is emitted from a light source (not shown), passes through the lens 1a, and is then transmitted through the liquid film onto the wafer W, whereby a predetermined pattern can be transferred to a resist.

Subsequently, in the state where the liquid film is formed between the lens 1a and the wafer W, the exposure means 1 is moved sliding on the wafer W so that the exposure means 1 can be located at a position corresponding to a next transfer region (shot region). Thereafter, by repeating the irradiating operation with light, the circuit pattern can be transferred successively to the surface of the wafer W.

In a wafer just after being subjected to such a dipping exposure process, a liquid, for example, pure water, used for the exposure process travels, as shown in FIG. 3, from the surface through the peripheral end face to a portion on the rear face, thus forming a liquid drop 11. The extent in which the liquid drop 11 is attached to the rear face of the wafer W is ranging from the peripheral end of the wafer W to a 2 mm inside position. In FIG. 13, reference numeral 12 denotes a resist film formed on the wafer W.

FIG. 14 shows a situation at a front end portion of a carrying arm which has been studied to carry the wafer W just after being subjected to the aforementioned dipping exposure process. In the drawing, reference numeral 13 designates an arm body and reference numeral 14 denotes a nail portion provided at a front end portion of the arm body 13. To the nail portion 14, a restricting portion 15 for controlling the position of the periphery of the wafer W is provided. A raised restricting face 15a disposed inside the restricting portion 15 is configured to face the peripheral end face of the wafer W, which is placed on the arm body 13, and adapted to control the position of the periphery of the wafer W. At the lower end of the restricting face 15a, a supporting face 16 for supporting the wafer W is provided in succession, for example, in a generally horizontal direction. On the further inside of the supporting face 16 provided in the nail portion 14, a downwardly inwardly inclined face 17 is provided.

The arm body 13 is operated such that it can scoop up the wafer W placed on, for example, a stage (not shown) provided in an exposure apparatus so as to place the wafer W on the supporting face 16 (FIGS. 14(a), 14(b)). In FIG. 14(b), the length from the peripheral end of the wafer W contacting with the supporting face 16 to the front end of the supporting face 16 is, for example, about 1 mm. When the wafer W is placed on the supporting face 16 in such a manner, the liquid forming the liquid drop 11 at the lower periphery of the wafer W is forced to move to the corner between the supporting face 16 and the restricting face 15a. Thereafter, when the wafer W is separated from the arm body 13 as shown in FIG. 14(c), the liquid 18 forced to move to the corner tends to remain attached to the corner due to the surface tension. Thus, by repeating such an operation, the liquid 18 remaining at the corner is gradually accumulated.

However, if the remaining liquid 18 is accumulated in such a manner, either by impact occurring when the arm body 13 receives a next wafer from the exposure apparatus, or by vibration of the arm body 13 carrying a next wafer after having received it, the liquid 18 may tend to scatter into the air and be attached again to the next wafer W. If water drops are attached to the surface of the wafer W, the temperature of each site to which the water drop is attached or of another site in which a water mark is produced becomes different from that of other sites upon a subsequent heating process, resulting in deterioration of the uniformity in the resist pattern face. Although it may be possible to wash the wafer W prior to heating, it is quite difficult to remove micro-water drops. Therefore, it is necessary to avoid the attachment of water drops to the wafer W during the carrying operation.

Furthermore, there may be a risk that the wafer W sticks to the arm body 13 due to the surface tension of the liquid 18, resulting in jumping of the wafer W from the arm body 13 upon transferring the wafer W toward the processing block, thereby causing a carrying error.

In addition, once the carrying operation of the wafer W in the developing apparatus is stopped, the liquid 18 accumulated at the corner may tend to be dried and produce particles 10 as shown in FIG. 15(a). These particles 10 may be produced by absorption of constituents in the air into the liquid 18 or by elution of components constituting the arm body 13 into the liquid 18 which is pure water. However, the principle of occurrence of such particles is now under investigation. Thereafter, when the carrying operation of the wafer W is restarted by the arm body 13, either by impact occurring when the arm body 13 receives a next wafer W from the exposure apparatus, or by vibration of the arm body 13 carrying a next wafer after having received it, the particles 10 may also tend to scatter into the air as shown in FIG. 15(b) and be transferred to the next wafer W. It should be noted that though a substrate holding means provided in a coating and developing apparatus is described in Patent Document 1, a countermeasure for addressing the aforementioned problem which may occur upon the introduction of the dipping exposure process is not covered therein.

Cited Patent Document:
Patent Document 1: TOKUKAIHEI No. 11-243133

SUMMARY OF THE INVENTION

The present invention was made to solve the aforementioned problem, and an object thereof is to provide a substrate carrying apparatus and a substrate carrying method, which can control contamination, such as reattachment of a liquid drop which has been attached to the rear face of a substrate to the same substrate, during a carrying operation of the substrate which has been subjected to a dipping exposure process. Another object of the present invention is to provide a coating and developing apparatus, which can control substrate contamination due to a dipping exposure process by providing such a substrate carrying apparatus in an interface, thereby avoiding lowering of the yield.

The present invention is a substrate carrying apparatus for carrying a substrate, on which a liquid remains, the substrate carrying apparatus comprising: an arm body; a plurality of supporting portions provided in the arm body and adapted to support the rear face of the substrate; a one-side restricting portion for restricting one side of the periphery of the substrate, and an other-side restricting portion for restricting the other side of the periphery of the substrate, these restricting portions being provided in the arm body to face each other; and liquid receivers provided to be positioned inside each of the restricting portions of the arm body.

Another aspect of the present invention is the substrate carrying apparatus, further comprising: a pressing means adapted to press the other end of the periphery of the substrate toward the one end after the substrate has been supported on the supporting portions; and wherein by pressing the other end of the periphery of the substrate toward its one end, the position of the one end of the periphery of the substrate can be restricted by the one-end restricting portion.

Another aspect of the present invention is the substrate carrying apparatus, wherein a suction port for sucking a liquid is provided in each liquid receiver.

Another aspect of the present invention is the substrate carrying apparatus, wherein the suction port is in communication with a suction path formed in the arm body.

Still another aspect of the present invention is the substrate carrying apparatus, wherein a gas discharging port for discharging a gas to be used for drying the rear face of the substrate is provided in each liquid receiver.

Another aspect of the present invention is the substrate carrying apparatus, wherein the gas discharging portion is in communication with a gas supply path formed in the arm body.

Still another aspect of the present invention is the substrate carrying apparatus, wherein a water absorbing material is provided in each liquid receiver.

Another aspect of the present invention is the substrate carrying apparatus, wherein in a bottom face of each liquid receiver is inclined laterally relative to a line defined between the one-side restricting portion and the other-side restricting portion such that the liquid attached to the bottom face can slide down therefrom.

The present invention is a coating and developing apparatus comprising: a processing block which includes a coating unit for coating a resist on a surface of a substrate, and a developing unit for developing the resist by supplying a developing liquid to the substrate after the resist on its surface has been subjected to an exposure process; and an interface through which the processing block and an exposure machine for forming a liquid layer on the surface of the substrate and then performing a dipping exposure process are connected; wherein the interface includes a substrate carrying apparatus for carrying a substrate, on which a liquid remains, toward the processing block; wherein the substrate carrying apparatus is adapted to carry a substrate, on which a liquid remains; and wherein the substrate carrying apparatus includes: an arm body; a plurality of supporting portions provided in the arm body and adapted to support the rear face of the substrate; a one-side restricting portion for restricting one side of the periphery of the substrate, and an other-side restricting portion for restricting the other side of the periphery of the substrate, these restricting portions being provided in the arm body to face each other; and liquid receivers positioned inside each of the restricting portions of the arm body.

The present invention is a substrate carrying method comprising the steps of: carrying a substrate, on which a liquid remains, by using a substrate carrying apparatus, which is a substrate carrying apparatus for carrying a substrate, on which a liquid remains, wherein the substrate carrying apparatus comprising: an arm body; a plurality of supporting portions provided in the arm body and adapted to support the rear face of the substrate; a one-side restricting portion for restricting one side of the periphery of the water, and an other-side restricting portion for restricting the other side of the periphery of the substrate, these restricting portions being provided in the arm body to face each other; and liquid receivers positioned inside each of the restricting portions of the arm body; and sucking the liquid accumulated in each liquid receiver positioned inside each of the restricting portions.

Another aspect of the present invention is the substrate carrying method, further comprising the step of: drying the rear face of the substrate by discharging a gas thereon.

Another aspect of the present invention is the substrate carrying method, wherein the step of sucking the liquid and the step of drying the substrate are performed at the same time.

Another aspect of the present invention is the substrate carrying method, further comprising the steps of: supporting the substrate on the supporting portions, while retracting a pressing means from the substrate, the pressing means being provided on the back side of the periphery of the substrate; and pressing the other side of the periphery of the substrate toward its one side by the pressing means so as to restrict the one side of the periphery of the water by the one-side restricting portion.

The substrate carrying apparatus of the present invention is configured such that the supporting portions support a region inside the periphery of the rear face of the substrate which has been subjected to a dipping exposure process, and a liquid receiver is provided between each supporting portion and each restricting portion for restricting the peripheral position of the wafer. Therefore, the liquid attached to the peripheral portion (the periphery or portions around it) of the rear face of the substrate can fall into each liquid receiver. Accordingly, even though repeated substrate carrying operations are performed and hence the liquid drop is accumulated in each liquid receiver, there is no risk that the periphery of the wafer W would collide with the liquid receivers, and therefore scattering in the air of the liquid drop and hence its reattachment to the surface of the wafer can be controlled.

The positional control of the substrate can be achieved by using the one-side restricting portion as well as by pressing the substrate from behind using the pressing means after the substrate has been placed on the arm body. In this way, the substrate can be always placed at a predetermined position, attaining the so-called automatic alignment, thereby providing a secure carrying operation for the wafer. In this case, the benefit obtained from providing the liquid receivers becomes quite significant because the collision of the substrate with the one-side restricting portion can be securely performed.

Furthermore, the provision of the suction port in each liquid receiver can facilitate removal of the liquid remaining on the liquid receiver, thereby controlling reattachment of the liquid to the substrate surface or occurrence of particles due to accumulation of liquid drops. Additionally, the gas discharging port in each liquid receiver can securely remove a liquid drop attached to the rear face of the substrate. If the water absorbing member is further provided in each liquid receiver, the liquid can be absorbed and eliminated from the liquid receiver with higher efficiency. Accordingly, this is also effective. Of course, various combinations of these techniques (the suction port, gas discharging port and water-absorbing member) can also be effective.

DETAILED DESCRIPTION OF THE INVENTION

EXAMPLES

Figure 1:
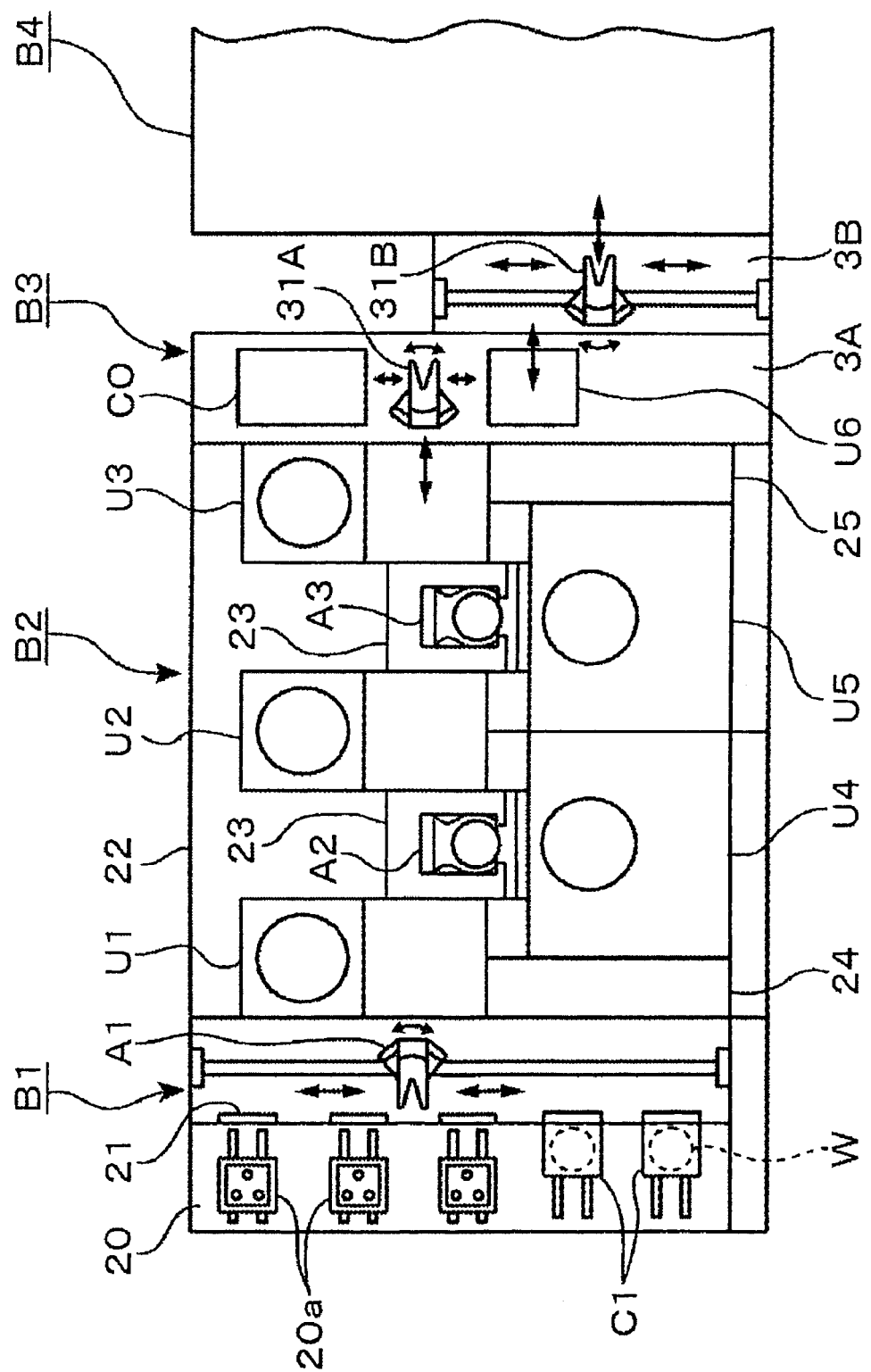
FIG. 1 is a plan view of a coating and developing apparatus including a substrate washing apparatus of the present invention.

One embodiment of the present invention will be briefly described with reference to FIGS. 1 and 2 with respect to the entire construction which is applied to a system for performing a dipping exposure process. This system is composed by connecting a coating and developing apparatus with an exposure machine. In the drawings, reference character B1 designates a carrier placing unit. The carrier placing unit B1 comprises a carrier station 20 including placing portions 20a for carrying in and carrying out carriers C1 in each of which, for example, thirteen pieces of wafers W are contained airtightly, opening and closing portions 21 provided at a wall located on the front side when viewed from the carrier station 20, and a transfer mean A1 for taking out the wafer W from each carrier C1 via the corresponding opening and closing portion 21.

On the back side of the carrier placing unit B1, a treating unit B2 surrounded by a housing 22 is provided. The treating unit B2 includes rack units U1, U2, U3 each being composed of multi-staged heating and cooling units, and liquid treating unit U4, U5, which are arranged in this order from the front end, and main carrying means A2, A3 adapted to receive and transfer wafers W between the respective units. These main carrying means A2, A3 are positioned in a space surrounded by partitioning walls 23 defined by faces on the sides of the rack units U1, U2, U3 arranged in front and behind when viewed from the carrier placing unit B1, faces on the sides of the liquid treating units U4, U5, and faces opposite to the liquid treating units U4, U5. In the drawings, reference numerals 24, 25 designate temperature humidity adjusting units including a temperature adjusting device or temperature humidity adjusting ducts for a treating liquid used in each of the units, respectively.

Figure 2:
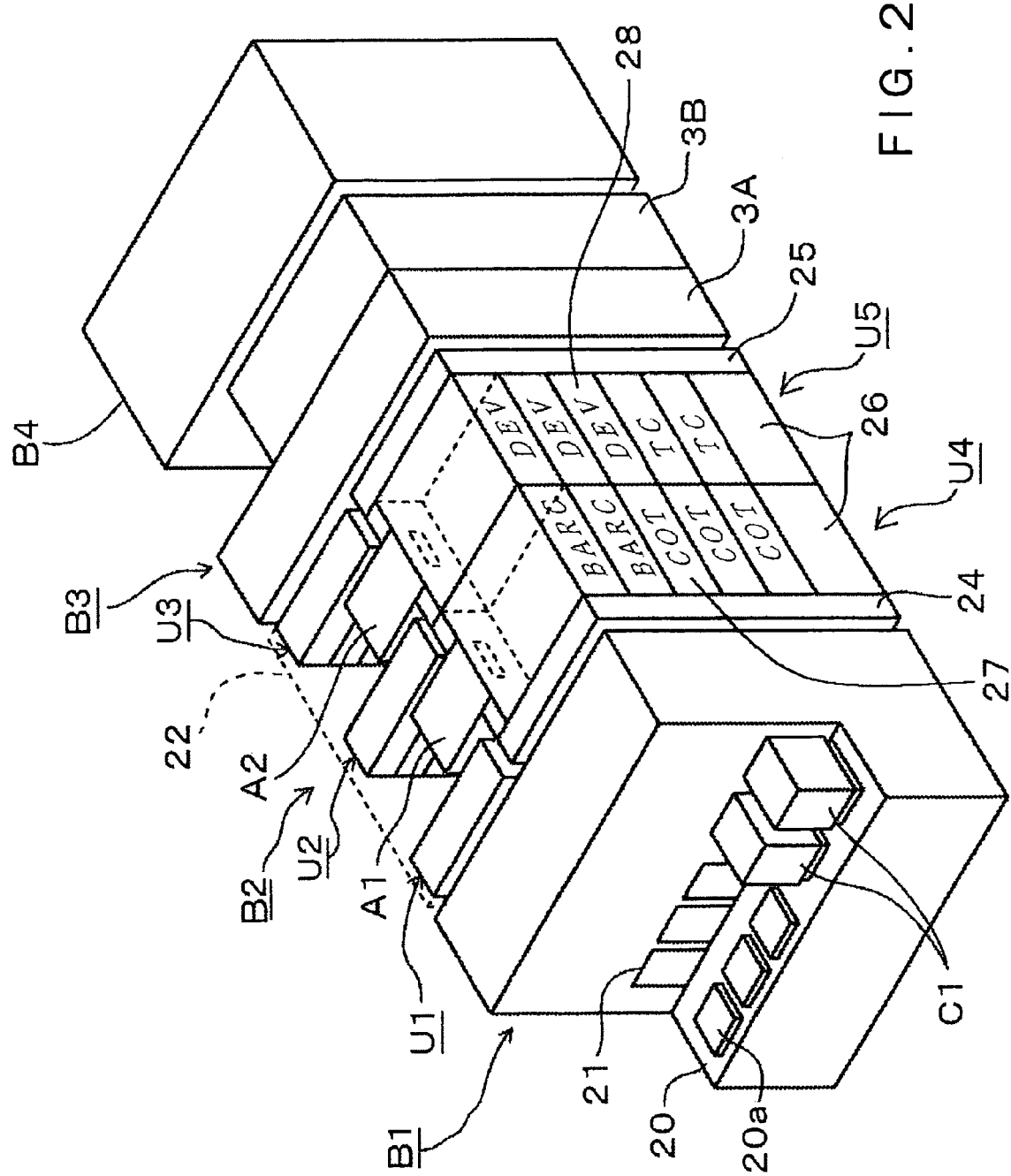
FIG. 2 is a perspective view showing the whole body of the coating and developing apparatus.

Each of the liquid treating units U4, U5, for example, as shown in FIG. 2, is composed of a chemical liquid containing portion 26 for containing a resist liquid or developing liquid, and coating units (COT) 27, developing units (DEV) 28, or antireflection film forming units (BARC), each being stacked on the corresponding chemical liquid containing portion 26 in five stages in total. Each of the rack units U1, U2, U3 is configured by stacking various units for performing pre-treatments and post-treatments for the treatments to be done in the liquid treating unit U4, U5, in plural stages, for example, in ten stages. Namely, the rack units U1, U2, U3 include heating units for heating (or baking) the wafer W and cooling units for cooling the wafer W.

To the back side of the rack unit U3 in the treating unit B2, an exposure unit B4 is connected via an interface B3. The interface B3, specifically, as shown in FIG. 1, comprises a first carrying chamber 3A and a second carrying chamber 3B, each provided between the treating unit B2 and the exposure unit B4, wherein the first carrying chamber 3A includes a first substrate carrying apparatus 31A while the second carrying chamber 3B includes a second substrate carrying apparatus 31B. In the first carrying chamber 3A, a rack unit U6 and a buffer cassette CO are further provided. Furthermore, in the rack unit U6, a heating unit (PEB) for applying a PEB treatment to the wafer W subjected an exposure process and a high accuracy temperature adjusting unit including a cooling plate, are stacked vertically.

Next, the flow of processing the wafer W in this system will be described briefly. When the carrier C1 containing the wafers W is placed on the placing table 20a, the corresponding opening and closing portion 21a as well as a cover of the carrier C1 are removed and each wafer W can be taken out from the transfer means A1. The wafer W is then transferred to the main carrying means A2 via a transferring unit constituting one stage of the rack unit U1. Thereafter, in one of the rack units U1 through U3, formation of an antireflection film or temperature adjustment of the substrate using a cooling unit is performed.

Then, the wafer W is carried by the main carrying means A2 into the coating unit (COT) 27 of the liquid treating unit U4, where a resist film is formed on the surface of the wafer W as well as a water-repellent film, which serves as a protective film, is formed outside the resist film formed on the surface of the wafer W, such that the water-repellent film extends from a periphery of the wafer surface through a peripheral end face to a periphery of the rear face. Thereafter, the wafer W is carried out by the main carrying means A2, and then into the heating unit to be subjected to a baking process at a predetermined temperature.

Once subjected to the baking process, the wafer is cooled in a cooling unit, carried into the interface B3 via a transferring unit in the rack unit U3, and then carried into the exposure unit B4 via the interface B3. In the exposure unit B4, an exposure machine 1 is arranged to face the surface of the wafer W to perform a dipping exposure operation.

Thereafter, the wafer W having undergone the dipping exposure is removed from the exposure unit B4 by means of the second substrate carrying apparatus 31B, and is then carried into a heating unit (PEB) which constitutes one stage of the rack unit U6. In the heating unit, a heating process is performed such that acids produced by the heating process from acid-producing ingredients contained in the resist located at the exposed site will diffuse into the resist. By the effect of the acids, for example, if the resist component is one of the positive-type resist, it becomes soluble to the developing liquid after the chemical reaction with the acids, while, if the resist component is one of the negative-type resist, it becomes insoluble to the developing liquid.

Subsequently, the wafer W is carried out from the heating unit by means of the first substrate carrying apparatus 31A, and then transferred to the main carrying means A3. By the main carrying means 31A, the wafer W is carried into the developing unit 28 of the liquid treating unit U5. In the developing unit 28, a dissolving liquid is supplied to the region where the water-repellent film of the wafer W is formed to dissolve and remove the water-repellent film, and a developing liquid is then supplied evenly onto the surface of the wafer W which has been subjected to the dissolving and removing process. By the supply of the developing liquid, the portion soluble to the developing liquid will be dissolved, whereby a predetermined patterned resist mask can be formed on the surface of the wafer W. Then, the wafer W is returned to the carrier C1 on the placing table 20a.

Figure 3:
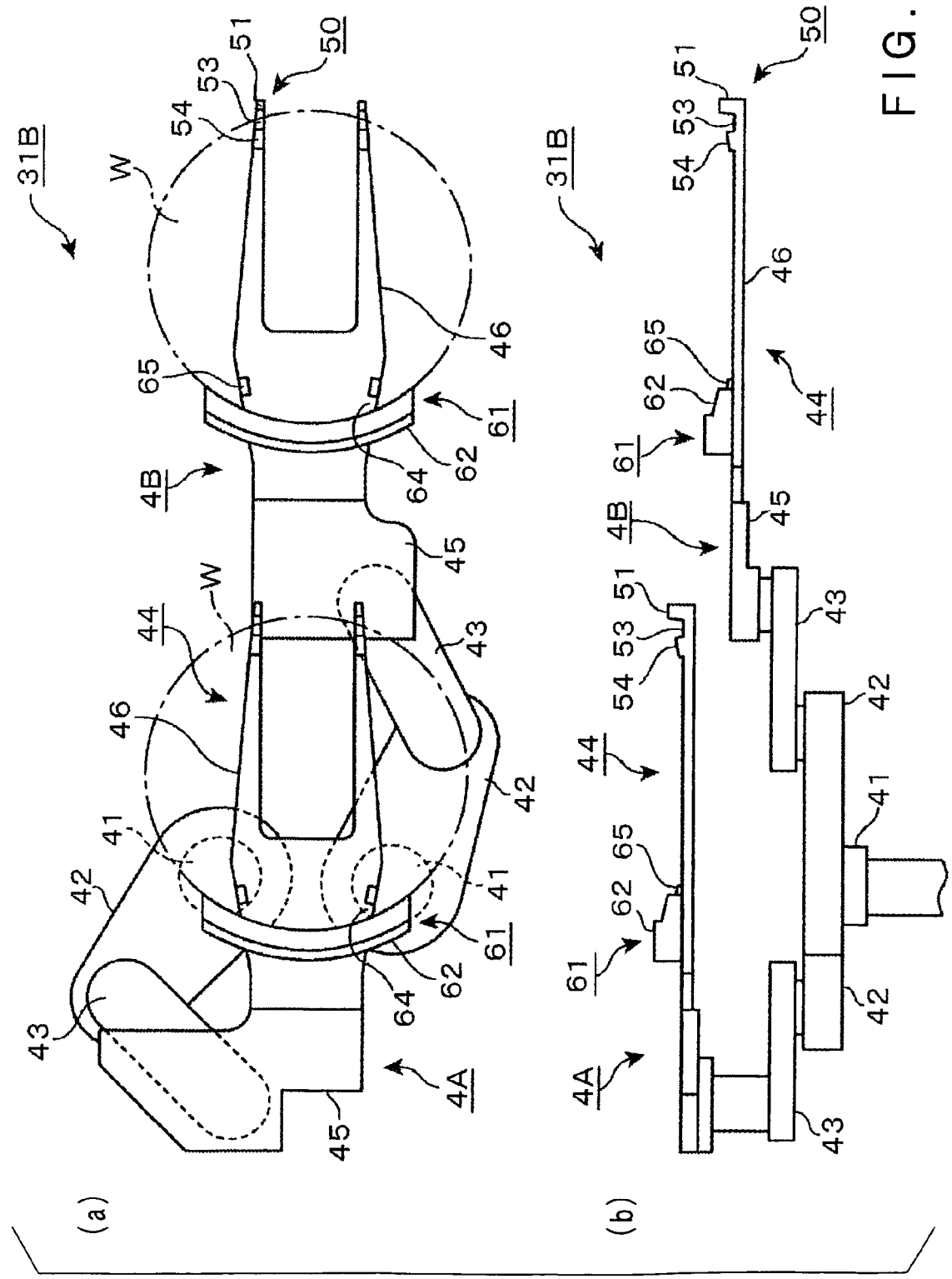
FIGS. 3(a) and 3(b) are a top view and a side view of a substrate carrying mechanism according to the present invention, respectively.

Next, the second carrying apparatus 31B will be described in detail. FIG. 3 shows a top face and a side face of the second substrate carrying apparatus 31B, which is composed of articulated carrying arms 4A, 4B which are independently operable to each other, and a carrying body 41 for supporting the carrying arms 4A, 4B. The carrying arms 4A, 4B are arranged such that they can be overlapped in this order from above, wherein the carrying arm 4A carries the wafer W before being subjected to the exposure process, from the first carrying chamber 3A to the exposure unit B4, while the carrying arm 4B carries the wafer W after being subjected to the dipping exposure process, from the exposure unit B4 to the first carrying chamber 3A. In one exemplary aspect, the carrying arms 4A and 4B have similar constructions, and are composed of first to third arms 42 to 44, respectively. One end of each first arm 42 is connected to the carrying substrate 41, while the other end of the first arm 42 is connected to one end of each second arm 43. Each third arm 44 is composed of a connecting portion 45 to which the other end of each second arm is connected, and an arm body 46 for holding the wafer W. The arm body 46, which will be described in more detail below, generally has a fork-like shape with two fork portions extending in the horizontal direction, and is connected at the connecting portion 45 on the substrate end. Each arm body 46 is configured to freely advance and retract via the first and second arms 42, 43 as well as to freely pivot about and move along the vertical axis, for example, due to the effect of the carrying body 41.

Figure 4:
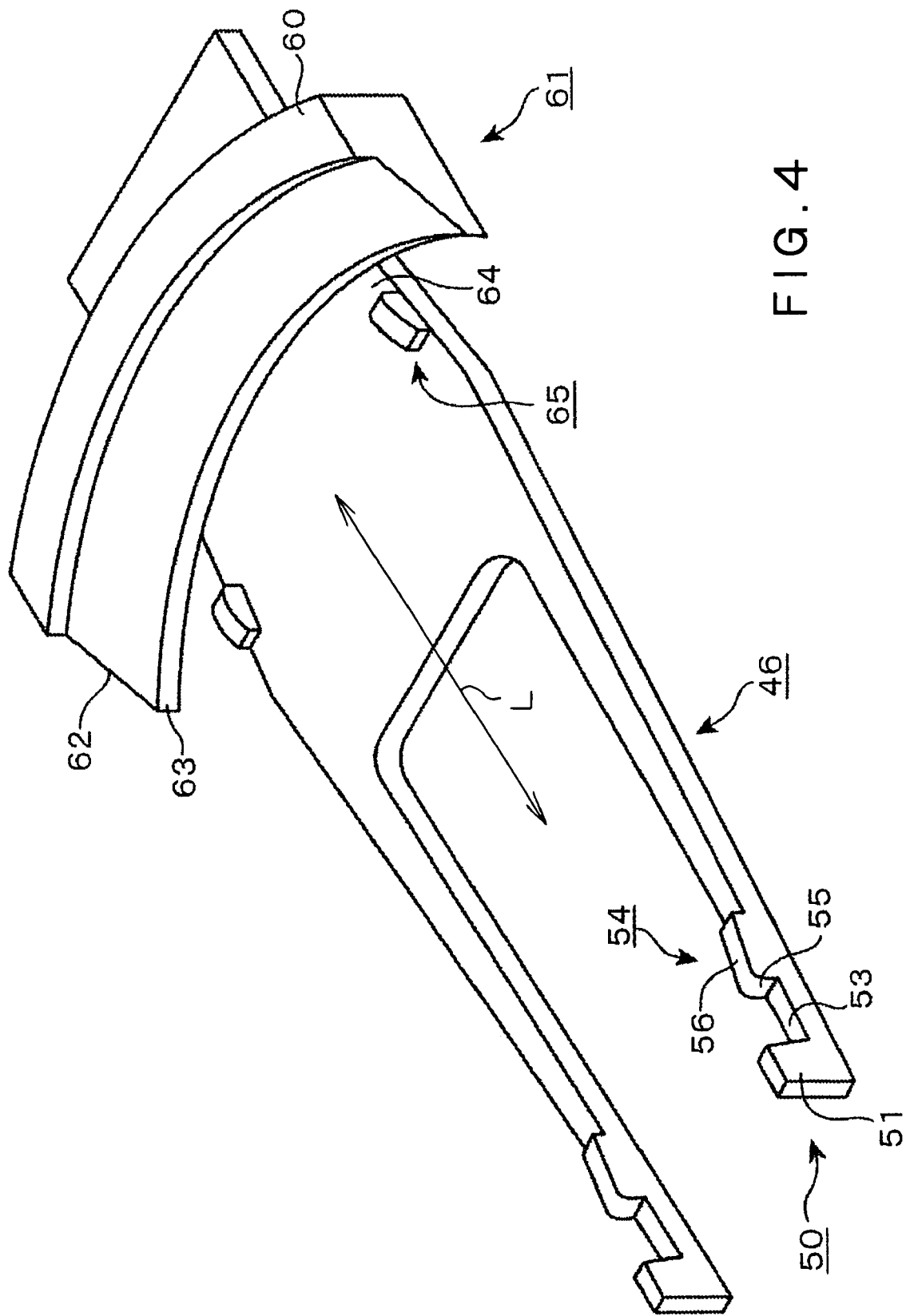
FIG. 4 is a perspective view of an arm body provided in the substrate carrying mechanism.
Figure 5:
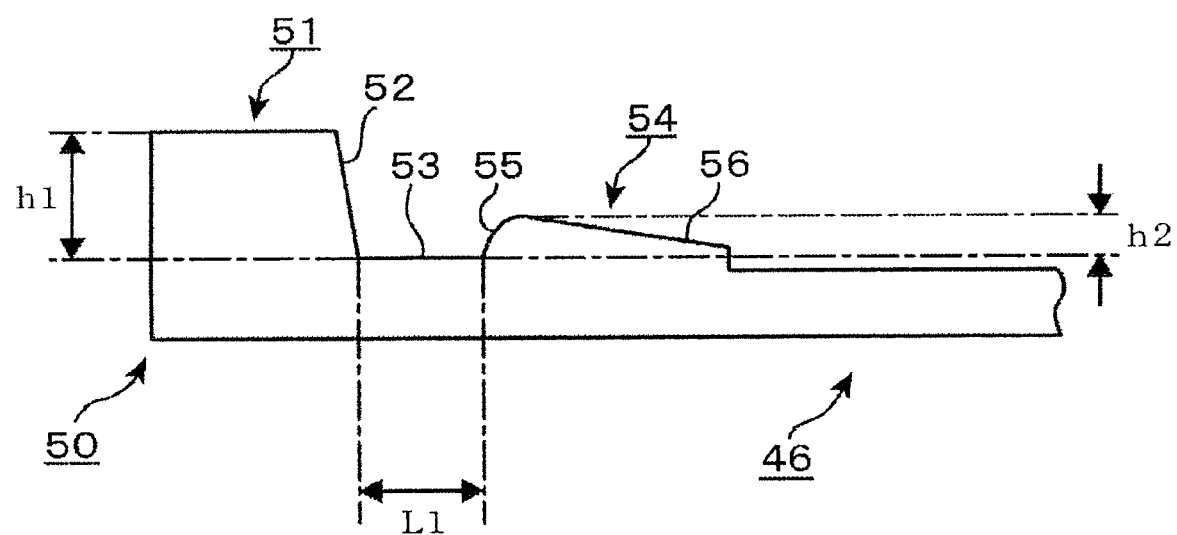
FIG. 5 is a side view showing a front end portion of the arm body.

The construction of the arm body 46 will now be described in more detail with reference to FIGS. 4 and 5. FIG. 4 is a perspective view of the arm body 46, and FIG. 5 is a side view of a front end portion of the arm body 46. In the drawings, reference numeral 51 designates, for example, a convex restricting portion (also referred to as a forward restricting portion or one-side restricting portion) provided in a front end of the arm body 46, and this forward restricting portion 51 constitutes a nail portion 50. The restricting portion 51 restricts the peripheral position of the wafer W, and includes an inwardly inclined restricting face 52. On the back side of the restricting portion 51, a convex supporting portion 54 is provided at an interval from the restricting portion 51. The supporting portion 54 includes a slope 55 which is inclined upward from the front side to the back side of the arm body 46, and another slope 56 inclined upward from the back side to the front side. For example, the slope 55 is configured to continue with the slope 56, wherein the slope 56 is more gradually inclined than the slope 55. In the drawings, reference numeral 53 denotes a liquid receiver which is surrounded by the restricting portion 51 and the supporting portion 54 and formed in a groove-like fashion. As will be described below, upon the alignment of the wafer W, the rear face of the wafer W is placed on an apex of each supporting portion 54 as well as on an apex of each supporting portion 65 which will be described later, while being interposed between each restricting face 52 and a restricting face 63 which will also be described layer. At this time, a liquid layer (liquid drop) formed on the rear face side of the periphery of wafer W can be received in each liquid receiver 53. As shown in FIG. 5, the length L1 from a front end to a back end of the liquid receiver 53 is, for example, approximately 5 mm. The height h1 from a flat face portion of the liquid receiver 53 to a top end of the restricting face 52 of the restricting portion 51 is, for example, 2 mm to 3 mm, and the height h2 from the flat face portion of the liquid receiver 53 to the apex of the supporting member 54 is, for example, approximately 1 mm.

On the side of the back periphery of arm body 46, a restricting portion 61 (also referred to as a back restricting portion or other-side restricting portion) is provided, which is formed into a fan-like block and adapted to control the position of the wafer W. In the restricting portion 61, an inclined face 62 is formed, which is downwardly inclined and extends toward the center of the fan shape. In FIG. 4, reference numeral 63 is a restricting face which is configured to be connected with the inclined face 62 and extend downwardly therefrom, and is adapted to restrict the peripheral position on the back side of the wafer W. A step 60 is formed at a back end of the inclined face 62, such that the peripheral position on the back side of the wafer W can be restricted by the step 60 even in the case where the wafer W is largely offset backwardly from a predetermined position relative to the arm body 46.

On the front side of the fan-like restricting portion 61, supporting portions 65 are provided, which are formed in substantially the same manner as the supporting members 54 at an interval from the restricting portion 61, and on which the rear face of the wafer W after aligned is placed. Unlike the supporting portions 54, each supporting portion 65 is configured such that the slope which is inclined upward from its front side to back side is more gradually inclined than the second slope which is inclined upward from the back side to the front side.

In the drawing, reference numeral 64 denotes a liquid receiver which is surrounded by the supporting portion 65 and the restricting portion 61, and is configured such that a liquid drop 74 attached on the rear face side of the periphery of wafer W can be received in each liquid receiver 64 when the wafer is placed on each supporting portion.

Figure 6:
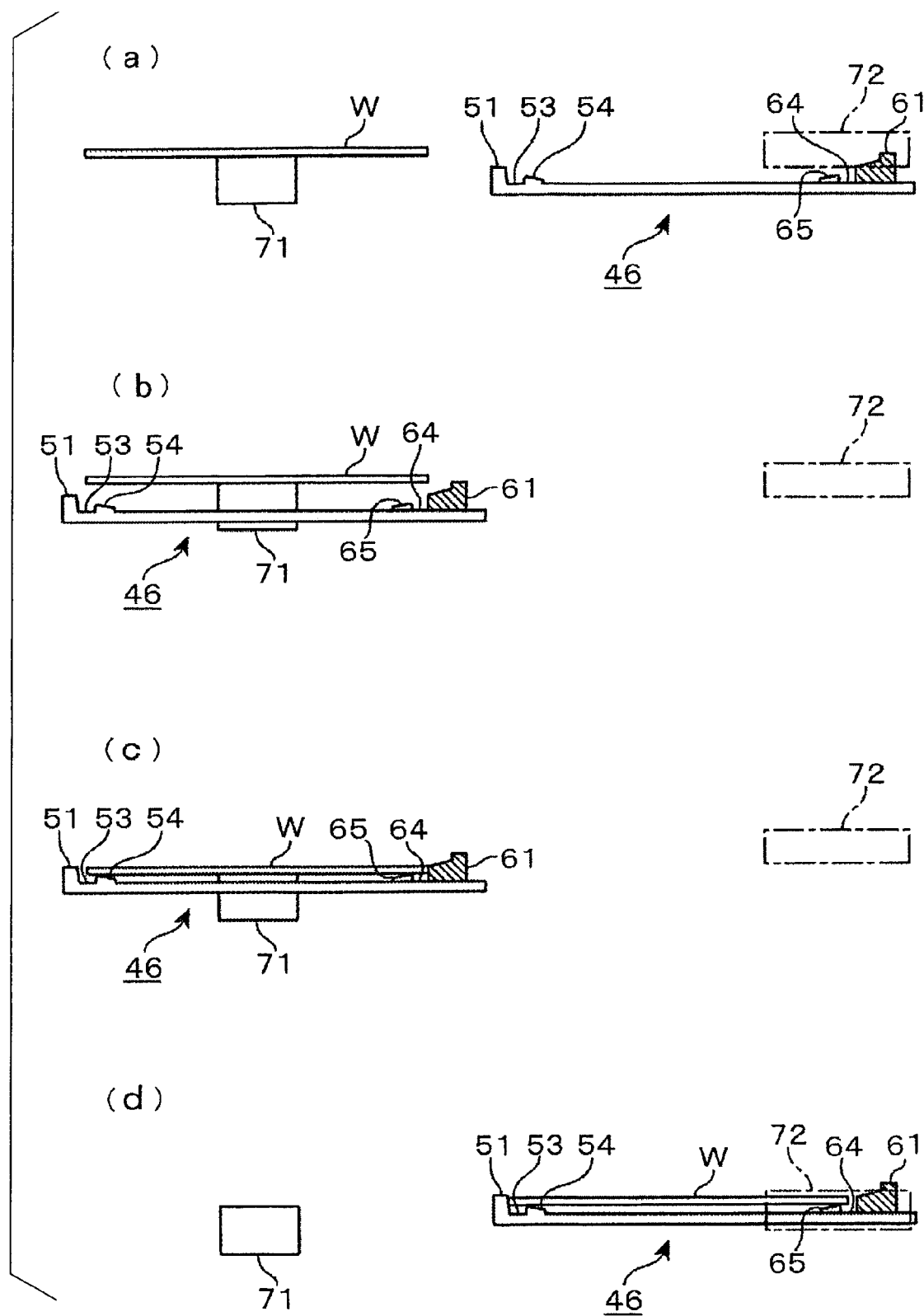
FIGS. 6(a), 6(b), 6(c) and 6(d) are illustrations for showing a manner in which a wafer is transferred to the substrate carrying mechanism, respectively.
Figure 7:
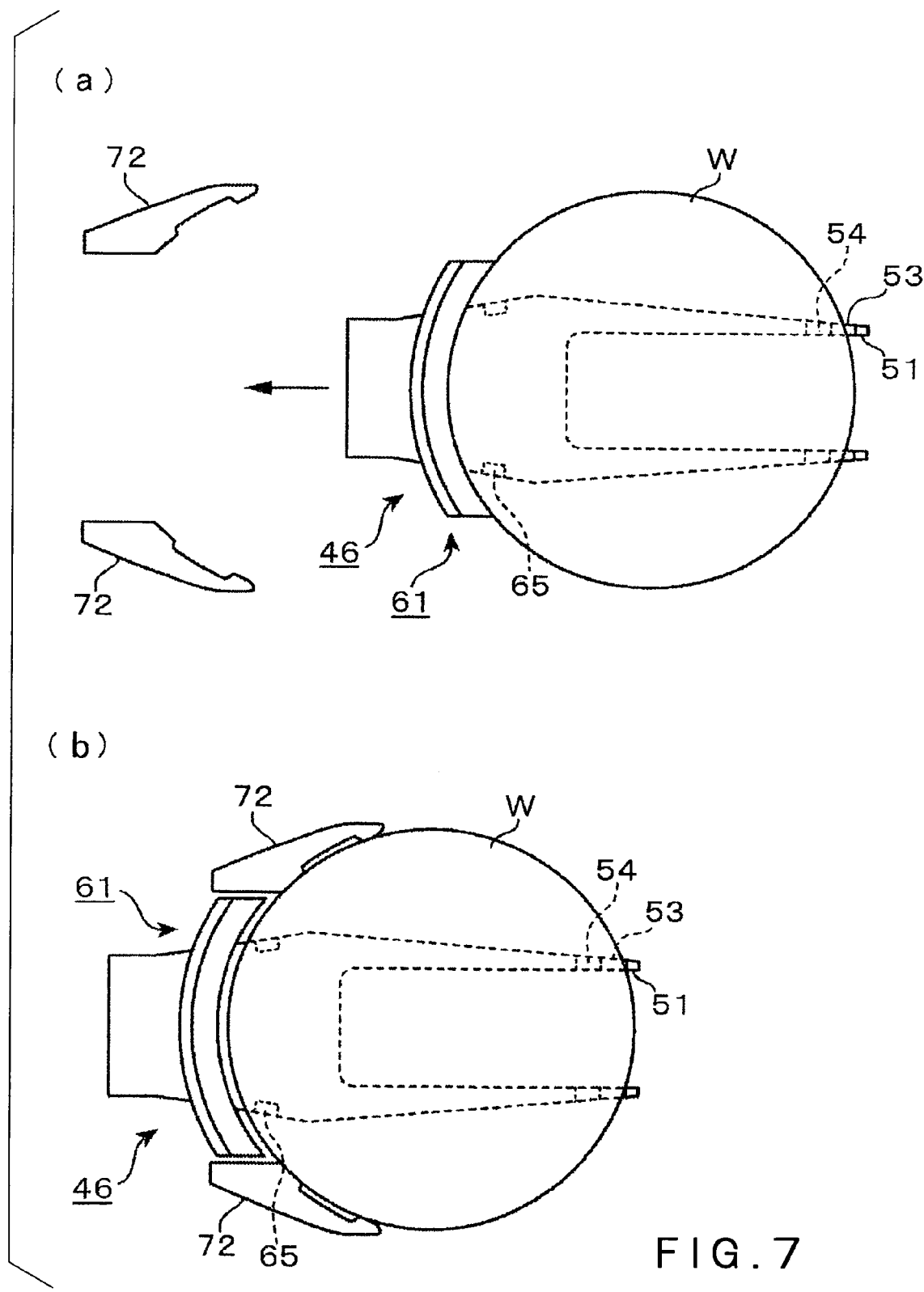
FIGS. 7(a) and 7(b) are illustrations for showing a manner in which a wafer placed on the substrate carrying mechanism is aligned, respectively.

Next, a manner in which the wafer W after being subjected to the dipping exposure process is transferred from the exposure unit B4 to the arm body 46 of the carrying arm 4B of the second substrate carrying apparatus 31B will be described with reference to FIGS. 6 and 7. In FIG. 6, reference numeral 71 designates a stage which is provided in the exposure unit B4 and on which the wafer W is placed. Reference numeral 72 is an alignment portion adapted to provide alignment for the wafer W, which will be described below in more detail. To avoid complicated expression, in FIG. 6, only the arm body 46 of the carrying arm 4B of the second substrate carrying apparatus 31B is shown, and the other portions of the second substrate carrying apparatus 31B are omitted therein.

First, the arm body 46 extends from its retracted position relative to the stage 71, advances toward the stage 71, and then gets into under the bottom face of the wafer W placed on the stage 71 (FIGS. 6(a), 6(b)). Thereafter, the arm body 46 is lifted up by means of the carrying body 41, and as such the wafer W is transferred to the arm body 46 such that it is placed on the supporting portions 54, 65 while being restricted between the restricting portions 51 and the opposite restricting portion 61 (FIG. 6(c)). Subsequently, the arm body 46 is retracted from the stage 71. During this retraction process, the periphery of the wafer W abut the alignment portions 72 disposed in the path of the wafer W, and hence is pushed in the reverse direction relative to the retraction direction of the arm body 46, whereby the wafer W can be aligned against the restricting portions 51 (FIG. 6(d)). FIGS. 7(a), 7(b) show a situation of the top faces of the alignment portions 72 and the arm body 46 in the case of performing the aforementioned alignment, respectively. In this example, the alignment portions 72 correspond to a pressing means for forwardly pressing the periphery on the back side of the wafer W on the arm body 46.

The alignment of the wafer W is not limited to this way, but each restricting portion and each supporting portion may be configured, for example, such that the arm body 46 receives the wafer from the stage 71 so that the periphery of the wafer W can ride on the slope 62 of the restricting portion 61 and the wafer W can then slide down due to its own weight on the slope 62 and be placed and aligned automatically on the supporting portions 54, 65.

Figure 8:
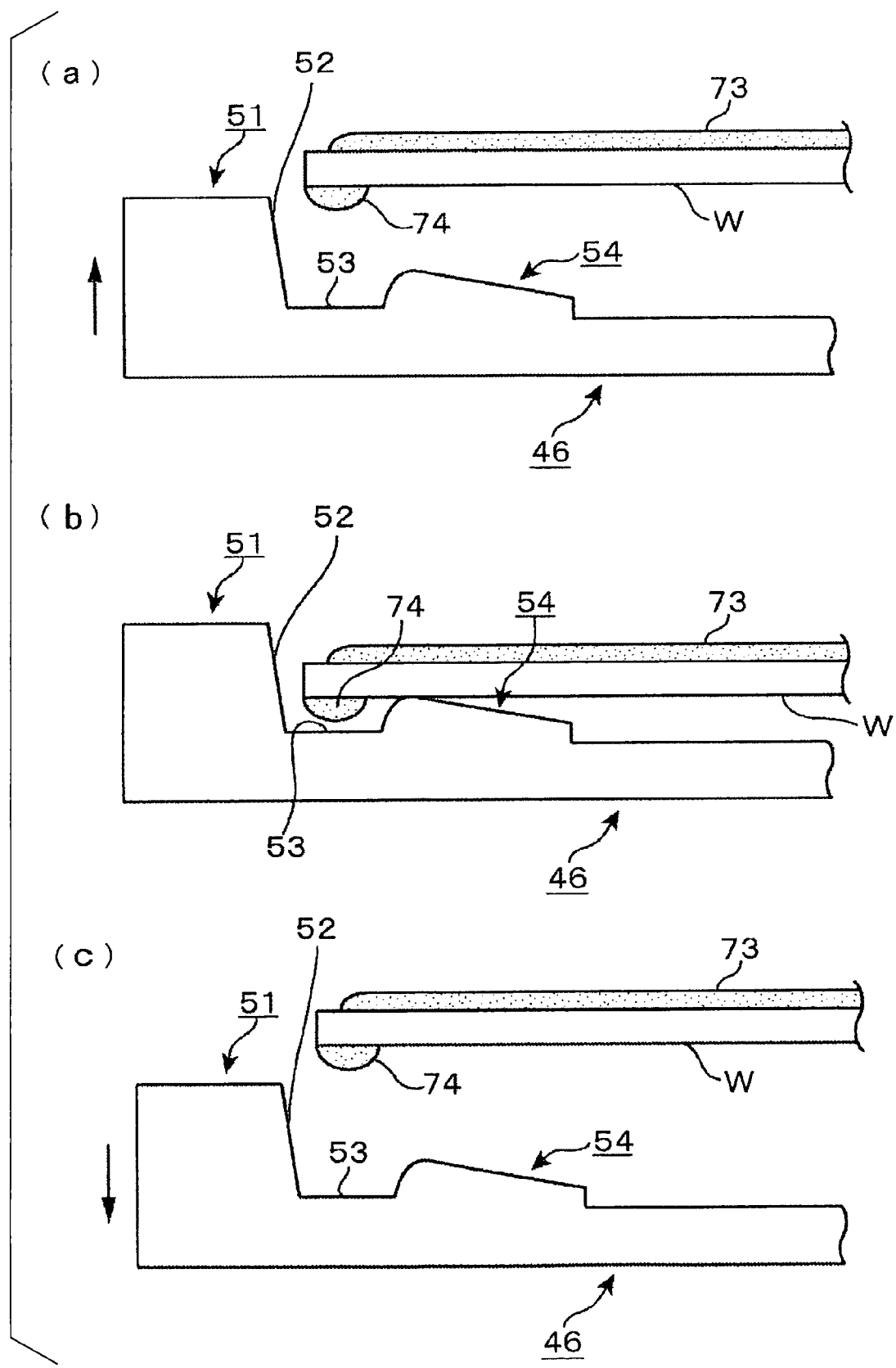
FIGS. 8(a), 8(b) and 8(c) are illustrations for showing a situation of a front end of the arm body when a wafer is transferred to the substrate carrying mechanism, respectively.
Figure 9:
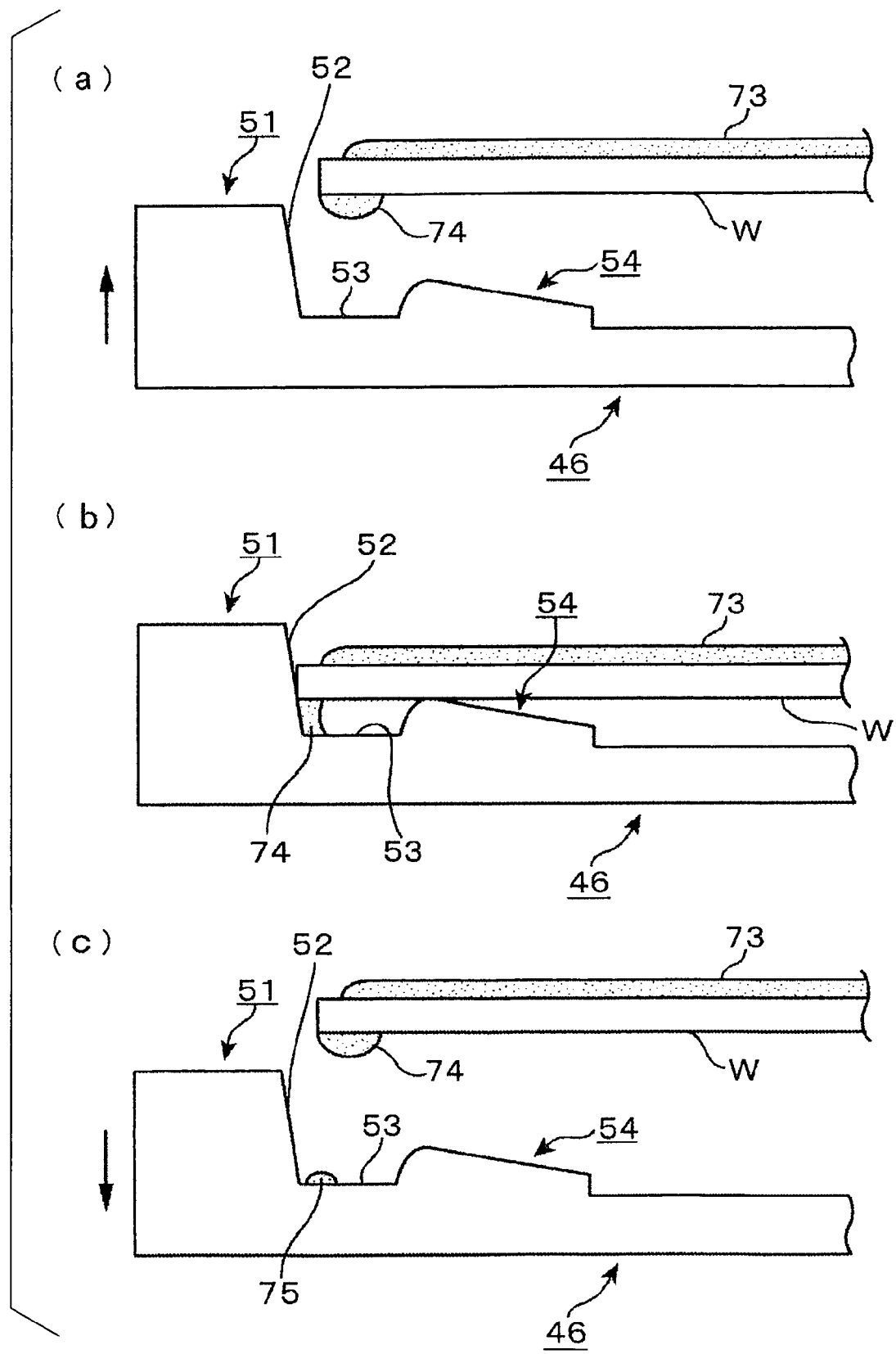
FIGS. 9(a), 9(b) and 9(c) are illustrations for showing a situation of a front end of the arm body when a wafer is transferred to the substrate carrying mechanism, respectively.

FIGS. 8 and 9 show a situation of a front end portion of the arm body 46 during the aforementioned transfer process of the wafer W, respectively. In the drawing, reference numeral 73 denotes a resist coated on the wafer W, while reference numeral 74 is a liquid drop 74 consisting of, for example, pure water attached to the rear face of the periphery of wafer W during the dipping exposure process performed in the exposure unit B4.

The arm body 46 is lifted toward the wafer W as shown in FIG. 8(a), and is then supported by the supporting portions 54, 65 as shown in FIG. 8(b) (the periphery of the wafer W is positioned above the liquid receivers 53, 64 before being aligned by the alignment portions 72). Thus, the liquid drop 74 attached to the periphery on the rear face side of wafer W can be received in the liquid receivers 53 Since the depth of the recess of each liquid receiver 53 is about 1 mm, the liquid drop 74, while depending on its size, is away slightly from the bottom face of the liquid receiver 53. Therefore, the liquid drop would not be attached to the nail portion 50 of the arm body 46, even if the wafer W is transferred to a next process from the arm body 46 as shown in FIG. 8(c).

It can be considered that the wafer W is transferred to the arm body 46 as shown in FIGS. 9(a) to 9(c) or that the wafer W is pushed relatively forward by the alignment portions and a part or all of the liquid drop 74 on the rear face of the wafer W is attached to each liquid receiver 53, and that such a liquid drop 75 remains in the liquid receiver 53 after the wafer W is transferred to a next process. In this case, when the arm body 46 receives a next wafer W from the exposure unit B4, even though some liquid drop 74 is attached to the rear face of the wafer W, the liquid drop 74 on the rear face side of the wafer W will come into contact with the remaining liquid drop 75 on the bottom face of the liquid receiver 53, thus the remaining liquid drop 75 will be absorbed and removed, due to the surface tension, into the liquid drop on the rear face side of the wafer W or otherwise will remain, as it is, in the liquid receiver 53. In either case, the liquid drops 74, 75 will not scatter into the air, and hence will not be reattached to the surface of the wafer W.

Though the situation of the front end portion of the arm body 46 has been described, the back end portion of the arm body 46 is also configured that a liquid drop attached on the rear face side of the wafer W can be received in each liquid receiver 64 as in the case of the front end portion. As a result, the liquid drop on the rear face of the wafer W and the liquid drop remaining in the liquid receiver 64 will not be reattached to the surface of the wafer W.

The second substrate carrying apparatus 31B of this embodiment supports portions, located more interior than the periphery of the rear face of wafer W having been subjected to the dipping exposure process, using the supporting portions 54, 65, and includes the liquid receivers 53, 64 between the supporting portions 54, 65 and restricting portions 51, 61 for restricting the peripheral positions of the wafer, respectively. Therefore, the liquid drops attached to the peripheral portions (the periphery or portions around it) of the rear face of wafer W can be transferred onto the liquid receivers 53, 64. Accordingly, even though the carrying operation of the wafer W would be repeated and thus the liquid drops would be accumulated in the liquid receivers 53, 64, since there is no risk that the periphery of the wafer W would collide with the liquid receivers 53, 64, scattering in the air of the liquid drop and hence its reattachment to the surface of the wafer W can be controlled.

After the wafer W is placed on the arm body 46, the second substrate carrying apparatus 31B is configured to control the position of the wafer W by pushing the wafer W from behind using the alignment portions 72 up to the forward restricting portions 51, thus it can place the wafer W at a predetermined position to achieve the so-called automatic alignment. Accordingly, a secure carrying operation of the wafer W can be provided.

Figure 10:
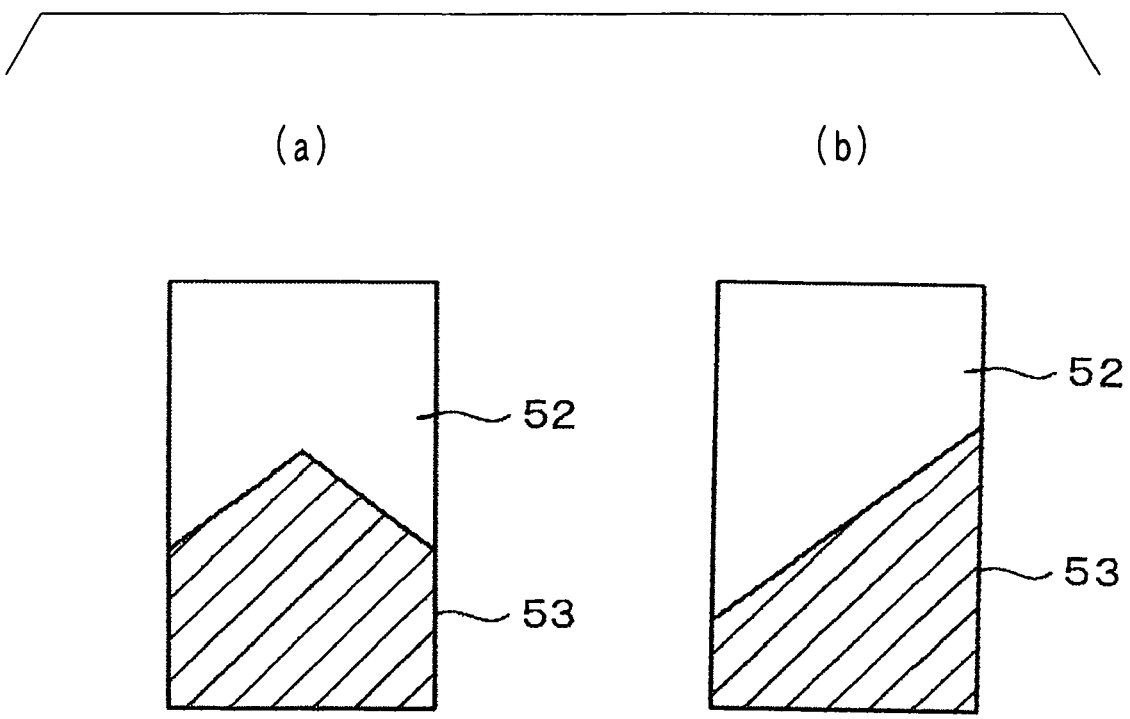
FIGS. 10(a) and 10(b) are longitudinal sections for showing structures of liquid receivers according to other embodiments, respectively.

The liquid receivers 53, 64 are not limited to have the aforementioned constructions. In order to securely control the accumulation of the liquid drop 74 in each of the liquid receivers 53, 64, for example, each liquid receiver 53 may be configured to have slopes each descending in the opposite directions laterally with respect to a line (along the direction L of FIG. 4) defined by connecting the front side restricting portion 51 and the back side restricting portion 61 as shown in FIG. 10(a), or it may be configured to have a slope descending leftward or rightward as shown in FIG. 10(b).

Figure 11:
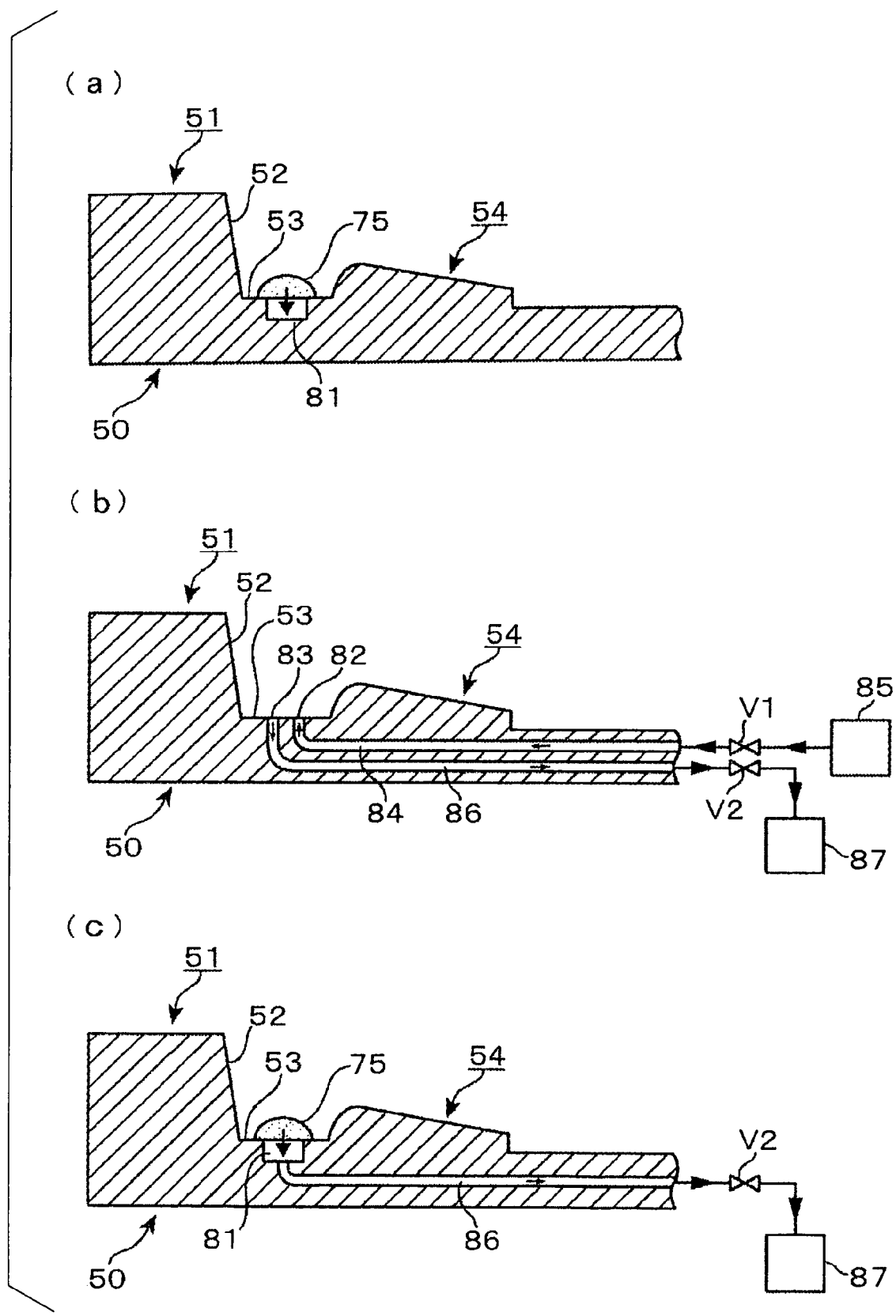
FIGS. 11(a), 11(b) and 11(c) are side views for showing arm bodies of the substrate carrying mechanism according to other embodiments, respectively.
Figure 12:
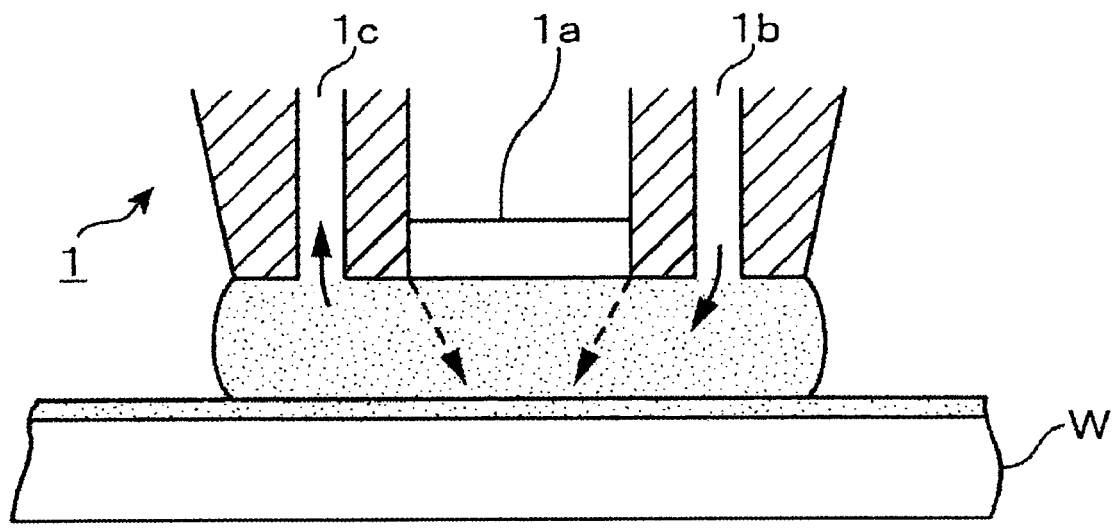
FIG. 12 is an illustration showing an exposure means for providing a dipping exposure process to a wafer.
Figure 13:
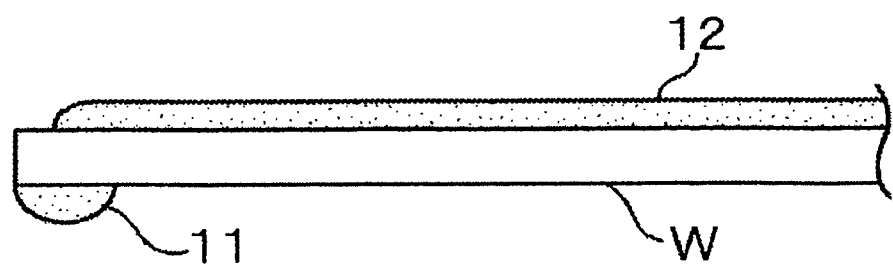
FIG. 13 is a side view showing a situation of a wafer just after having been subjected to a dipping exposure process.
Figure 14:
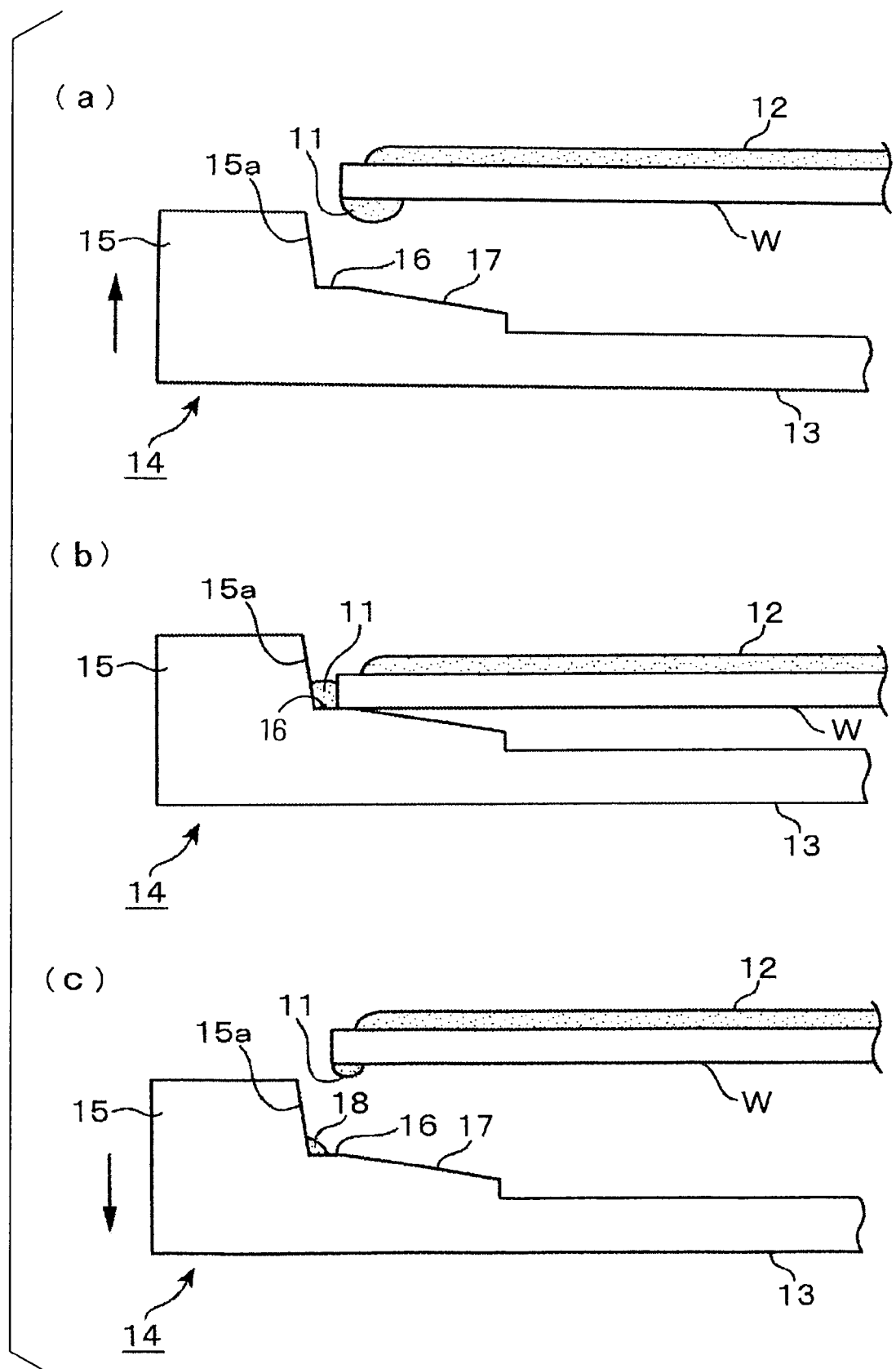
FIGS. 14(a), 14(b) and 14(c) are illustrations for showing a situation in which a wafer is transferred by a conventional substrate carrying mechanism.
Figure 15:
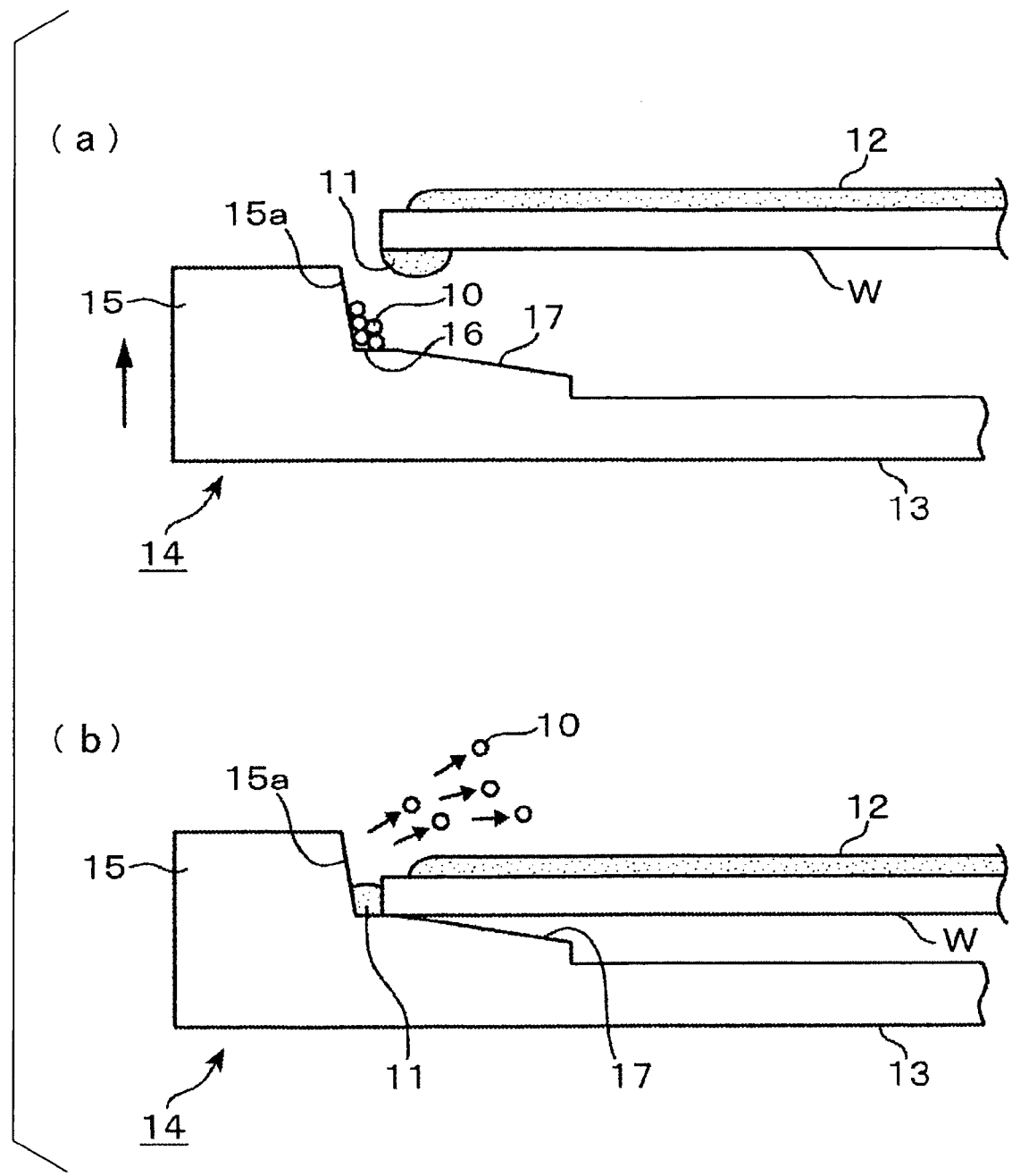
FIGS. 15(a) and 15(b) are illustrations for showing a situation in which particles scatter into the air when a wafer is carried by a conventional substrate carrying mechanism.

Alternatively, as shown in FIG. 11(a), a water absorbing member 81, for example, a sponge, non-woven fabric, water absorbing paper or water absorbing fibers may be provided at a bottom portion of each liquid receiver 53 to absorb the liquid 75 remaining the liquid receiver 53 into the water absorbing member 81 as depicted by an arrow in the drawing, thereby removing the liquid from the liquid receiver 53. It can be appreciated that the water absorbing member 81 may be replaced. At a bottom portion of each back side liquid receiver 64 of the arm body 46, the water absorbing member 81 may be provided in the same manner as that of the liquid receiver 53 to absorb the liquid remaining in the liquid receiver 64 into the water absorbing member 81, thereby removing the liquid from the liquid receiver 64.

In the present invention, the arm body 46 may be configured, for example, as shown in FIG. 11(b), in addition to the aforementioned embodiments. In the face of the liquid receiver 53 of the arm body 46 shown in FIG. 11(b), a gas discharging port 82 and a suction port 83 for sucking a liquid attached to the liquid receiver 53 are provided, wherein the discharging port 82 is in communication with, for example, a gas supply path 84 provided in the arm body 46. The other end of the gas supply path 84 is connected via a valve V1 to a gas supply source 85, in which an inert gas such as N2 (nitrogen) gas is accumulated. The gas discharged from the discharging port 82 is not limited to an inert gas, but may be a gas used for drying, such as air or the like. The suction port 83 is connected with, for example, a suction path 86 provided in the arm body 46, wherein the other end of the suction path 86 is connected to a suction means 87, for example a vacuum pump, through a valve V2.

The valve V2 is opened immediately after the arm body 46 receives the wafer W from the stage 71 of the exposure unit B4 and is aligned as describe above to suck a liquid attached to the liquid receiver 53 via the suction port 83. At the same time, the valve V1 may be opened to dry the rear surface of the wafer W by discharging N2 gas at a flow amount such that the wafer W will not float from the substrate supporting portions 54, 56, and the suction step and gas supply may then be stopped, for example, after a predetermined period of time. In the case where the arm body 46 is constructed to perform such an operation, since the liquid drops attached to the rear surface of the wafer W can be blown away, sucked and removed from the suction port 83, there is no risk for the liquid drop to be reattached on the surface of the wafer W upon carrying operation of wafer W. Furthermore, the need for cleaning the nail portion of the arm body 46 can be eliminated, or the number of cleaning steps can be decreased, thus providing superior maintenance properties.

In the arm body 46 shown in FIG. 11(b), the timing of blowing N2 gas against the wafer W or the timing of performing suction of the liquid in the liquid receiver is not limited to the aforementioned example. Alternatively, the blowing or suction may be started before the arm body 46 receives the wafer W.

On the surface of each liquid receiver 64 provided on the back side of the arm body 46, the suction port 83 connected to the suction means 87 and the discharging port 82 connected to the gas supply source 85 may be provided, such that the liquid attached to the liquid receiver 64 can be removed as well as the rear surface of the wafer W can be dried by discharging a gas from the discharging port 82 of the liquid receiver 64 onto the wafer W.

The gas supply path 84 and the suction path 86 are not limited to be formed in the arm body 46, but may be disposed outside the arm body 46. However, since the piping is moved together with the telescopic movement of the arm body, it is preferred that such piping is formed in the arm body so as to ensure the piping route utilizing the interior of rotating shafts of articulating portions of each arm.

Alternatively, as shown in FIG. 11(c), the arm body 46 may be configured such that the water absorbing member 81 is provided on a bottom portion of each liquid receiver 53, wherein one end of the suction path 86 is connected to the water absorbing member 81, and the other end of the suction path 86 is connected to the suction means 87. As a result, the liquid 75 accumulated in the liquid receiver 53 can be absorbed by the water absorbing member 81 and removed from the liquid receiver 53. In addition, when opening the valve V2, the liquid 75 contained in the water absorbing member 81 can be sucked and removed by the suction means 87, thereby drying the water absorbing member 81. Namely, by forming the arm body 46 in such a configuration, the number of exchanging the water absorbing members 81 can be decreased.

In the bottom face of each liquid receiver 64 on the back side of the arm body 46, the water absorbing member 81 connected to the suction means 87 via the suction path 86 may be provided in the same manner as in the case of the liquid receiver 53, whereby the liquid 75 accumulated in the liquid receiver 64 can be absorbed in the water absorbing member 81, and the water contained in the water absorbing member 81 can be removed by the suction means 87 so as to dry the water absorbing member 81.

The invention claimed is:

1. A substrate carrying apparatus for carrying a substrate, on which a liquid remains, the substrate carrying apparatus comprising:
    an arm body;
    a plurality of supporting portions provided in the arm body and adapted to support the rear face of the substrate;
    a one-side restricting portion for controlling one side of the periphery of the substrate, and an other-side restricting portion for controlling the other side of the periphery of the substrate, these restricting portions being provided in the arm body to face each other; and
    liquid receivers positioned inside each of the restricting portions of the arm body.

2. The substrate carrying apparatus according to claim 1, further comprising: a pressing means adapted to press the other end of the periphery of the substrate toward the one end after the substrate has been supported on the supporting portions; and wherein by pressing the other end of the periphery of the substrate toward its one end, the one end of the periphery of the substrate can be restricted by the one-end restricting portion.

3. The substrate carrying apparatus according to claim 1, wherein a suction port for sucking a liquid is provided in each liquid receiver.

4. The substrate carrying apparatus according to claim 1, wherein the suction port is in communication with a suction path formed in the arm body.

5. The substrate carrying apparatus according to claim 1, wherein a gas discharging port for discharging a gas to be used for drying the rear face of the substrate is provided in each liquid receiver.

6. The substrate carrying apparatus according to claim 5, wherein the gas discharging portion is in communication with a gas supply path formed in the arm body.

7. The substrate carrying apparatus according to claim 1, wherein a water absorbing material is provided in each liquid receiver.

8. The substrate carrying apparatus according to claim 1, wherein a bottom face of each liquid receiver is inclined laterally relative to a line defined between the one-side restricting portion and the other-side restricting portion such that the liquid attached to the bottom face can slide down therefrom.

9. A coating and developing apparatus comprising:
a processing block which includes a coating unit for coating a resist on a surface of a substrate, and a developing unit for developing the resist by supplying a developing liquid to the wafer after the resist on its surface has been subjected to an exposure process; and
an interface through which the processing block and an exposure machine for forming a liquid layer on the surface of the substrate and then performing a dipping exposure process are connected;
wherein the interface includes a substrate carrying apparatus for carrying a substrate, on which a liquid remains, toward the processing block;
wherein the substrate carrying apparatus is adapted to carry a substrate, on which a liquid remains; and
wherein the substrate carrying apparatus includes:
an arm body;
a plurality of supporting portions provided in the arm body and adapted to support the rear face of the substrate;
a one-side restricting portion for controlling one side of the periphery of the substrate, and an other-side restricting portion for controlling the other side of the periphery of the wafer, these restricting portions being provided in the arm body to face each other; and
liquid receivers positioned inside each of the restricting portions of the arm body.

10. A substrate carrying method comprising the steps of:
carrying a substrate, on which a liquid remains, by using a substrate carrying apparatus, which is a substrate carrying apparatus for carrying a substrate, on which a liquid remains, wherein the substrate carrying apparatus comprising: an arm body; a plurality of supporting portions provided in the arm body and adapted to support the rear face of the substrate; a one-side restricting portion for controlling one side of the periphery of the wafer, and an other-side restricting portion for controlling the other side of the periphery of the substrate, these restricting portions being provided in the arm body to face each other; and liquid receivers positioned inside each of the restricting portions of the arm body; and
sucking the liquid accumulated in each liquid receiver positioned inside each of the restricting portions.

11. The substrate carrying method according to claim 10, further comprising the step of: drying the rear face of the substrate by discharging a gas thereon.

12. The substrate carrying method according to claim 11, wherein the step of sucking the liquid and the step of drying the substrate are performed at the same time.

13. The substrate carrying method according to claim 10, further comprising the steps of:
supporting the substrate on the supporting portions, while retracting a pressing means from the substrate, the pressing means being provided on the back side of the periphery of the substrate; and
pressing the other side of the periphery of the substrate toward its one side by the pressing means so as to restrict the one side of the periphery of the substrate by the one-side restricting portion.

* * * * *